United States Patent
Jung

(10) Patent No.: US 7,184,510 B2
(45) Date of Patent: Feb. 27, 2007

(54) DIFFERENTIAL CHARGE PUMP

(75) Inventor: Soon-Gil Jung, Santa Clara, CA (US)

(73) Assignee: Quicklogic Corporation, Sunnyvale, CA (US)

( * ) Notice: Subject to any disclaimer, the term of this patent is extended or adjusted under 35 U.S.C. 154(b) by 705 days.

(21) Appl. No.: 10/672,798

(22) Filed: Sep. 26, 2003

(65) Prior Publication Data

US 2005/0185746 A1    Aug. 25, 2005

(51) Int. Cl.
*H03D 3/24* (2006.01)
*H03L 7/08* (2006.01)

(52) U.S. Cl. .................. 375/374; 375/376; 327/157

(58) Field of Classification Search ........ 375/374–376; 327/148, 157, 536
See application file for complete search history.

(56) References Cited

U.S. PATENT DOCUMENTS

| | | | | |
|---|---|---|---|---|
| 6,011,822 A * | 1/2000 | Dreyer | ................ | 375/376 |
| 6,275,097 B1 | 8/2001 | Liang et al. | ................ | 327/536 |
| 6,466,070 B1 | 10/2002 | Ross | ................ | 327/157 |
| 6,509,770 B2 | 1/2003 | Gossmann et al. | ........ | 327/157 |
| 6,515,520 B2 | 2/2003 | Kiyose | ................ | 327/108 |
| 6,535,051 B2 | 3/2003 | Kim | ................ | 327/536 |
| 6,711,229 B1 * | 3/2004 | Harada | ................ | 375/376 |
| 7,015,734 B1 * | 3/2006 | Pettersen | ................ | 327/157 |

OTHER PUBLICATIONS

Ian A. Young, "A PLL Clock Generator with 5 to 110 MHz of Lock Range for Microprocessors", IEEE Journal of Solid-State Circuits, vol. 27, No. 11, Nov. 1992, pp. 1599-1607.
Ilya I. Novof, "Fully Integrated CMOS Phase-Locked Loop with 15 to 240 MHz Locking Range and ±ps Jitter", IEEE Journal of Solid-State Circuits, vol. 30, No. 11, Nov. 1995, pp. 1259-1266.

* cited by examiner

*Primary Examiner*—Don N. Vo
(74) *Attorney, Agent, or Firm*—Silicon Valley Patent Group LLP

(57) ABSTRACT

A differential charge pump includes a transient reducing circuit that provides multiple switching current paths to reduce transients caused by the charge transfer as the charge pump is switched. The differential charge pump includes separate current sources in the transient reducing circuit that are switchably coupled to the non-active current source in the charge pump. In one embodiment, each current sources include a static current source and a variable current source that is controlled by a common mode feedback circuit. The variable current source may produce a current with less magnitude than the current produced by the static current source.

16 Claims, 4 Drawing Sheets

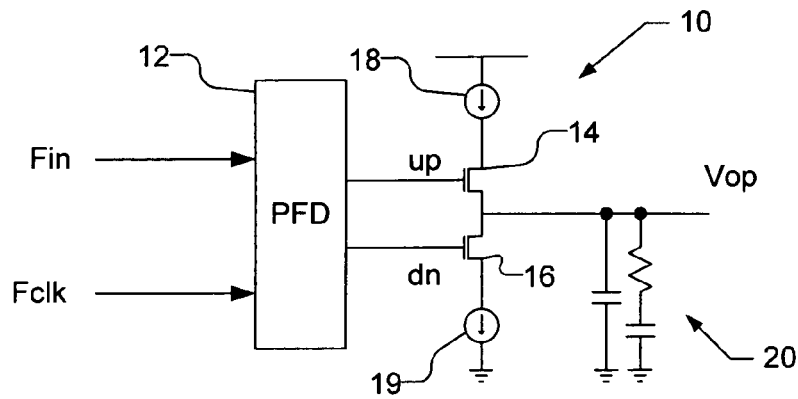
Fig. 1
(Conventional)
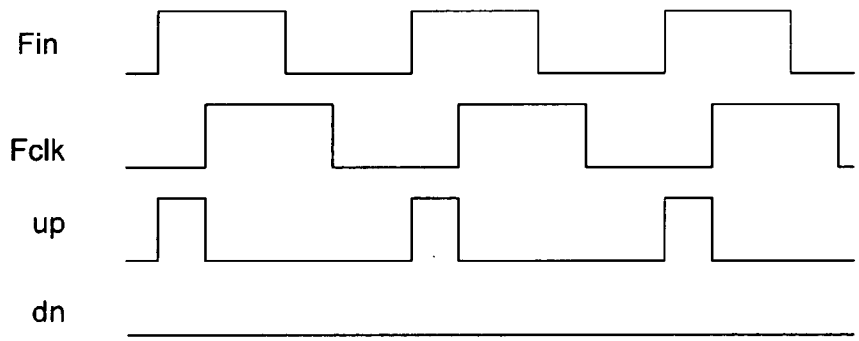
Fig. 2A
(Conventional)
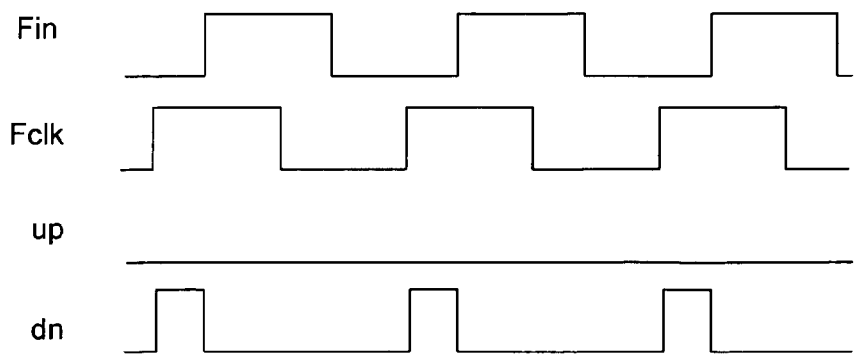
Fig. 2B
(Conventional)

DIFFERENTIAL CHARGE PUMP

FIELD OF THE INVENTION

The present invention relates to charge-pump circuits, and in particular to fully differential charge-pump circuits with current common-mode feedback.

BACKGROUND

Phase locked loop circuits (PLL) are used to generate an output signal that has the same phase as a reference signal. Typically, PLLs include a phase/frequency detector, a charge pump, loop filter, and a controlled oscillator. The charge pump provides the output signal(s) that control the oscillator.

FIG. 1 illustrates a conventional single ended charge pump 10 that may be used in a PLL, along with a phase/frequency detector (PFD) 12. Charge pump 10 includes transistors 14 and 16, which may be, e.g., n-channel transistors, coupled in series between current sources 18 and 19. The PFD 12 receives and compares the frequency of a reference clock signal (Fin) with a feedback clock signal (Fclk). The PFD 12 provides an up voltage signal to transistor 14 and a down (dn) voltage signal to transistor 16. The output terminal of the charge pump 10 is between transistors 14 and 16 and provides a control voltage Vop to a voltage controlled oscillator (not shown). A loop filter 20 is disposed between the charge pump 10 and the voltage controlled oscillator.

Timing diagrams for the single-ended charge pump 10 are illustrated in FIGS. 2A and 2B. In operation, PFD 12 compares the frequency of a reference clock signal (Fin) with the feedback clock signal (Fclk). If the phase or frequency of the feedback clock Fclk is delayed compared to the reference clock frequency Fin, the PFD 12 generates an up signal, as illustrated in FIG. 2A, and a low down signal. The up signal is received by transistor 14 and the low down signal is received by transistor 16. Thus, the current source 16 will charge the loop filter 20, which will increases the VCO control voltage Vop.

If the phase or frequency of the feedback clock Fclk leads the reference clock Fin, the PFD 12 generates a down (dn) signal, as illustrated in FIG. 2B and a low up signal. The dn signal is received by transistor 16 and the up signal is received by transistor 14. Thus, the loop filter 20 will discharge via transistor 16, which will decrease the control voltage Vop. When Fin and Fclk are in phase with a same frequency, the up and dn signal have the same minimum pulse width to avoid a dead zone, which improves the linearity of the charge-pump characteristic curve while avoiding changing the control voltage Vop.

FIG. 3 illustrates a conventional fully differential charge-pump circuit 50 with a common-mode dc feedback. Charge pump 50 includes four pairs of differential n channel transistors 55 and 56, 57 and 58, 59 and 60, and 61 and 62. Each differential pair of transistors receives differential signals (up, /up, and dn, /dn) from the phase/frequency detector in the PLL. Thus, for example, transistors 55 and 56 receive the up voltage signal and the up bar (/up) signal, respectively, as do transistors 61 and 62. Similarly, transistors 57 and 58 receive the down (dn) and the down bar (/dn) signals, respectively, as do transistors 59 and 60.

Transistors 55 and 57 are coupled in series, as are transistors 56 and 58, between current sources 52 and 54, and an output terminal is disposed between transistors 55 and 57. A loop filter 18a is coupled to the output terminal between transistors 55 and 57, which produces a control voltage Vop. An op-amp 59 is also disposed between current sources 52, 54, with the non-inverting input terminal coupled to the output terminal disposed between transistors 55 and 57 and the output terminal of the op-amp 59 is coupled between transistors 56 and 58 and is coupled to the inverting input terminal to form a negative feedback loop.

Similarly, transistors 59 and 61 are coupled in series, as are transistors 60 and 62, between current sources 62 and 64 and an output terminal is disposed between transistors 59 and 61. A second loop filter 18b is coupled to the output terminal between transistors 59 and 61, which produces a control voltage Von. A second op-amp 69 is disposed between series coupled transistors 59, 61 and 60, 62 similar to the configuration of op-amp 59 described above.

A trans-conductance amplifier 70 is coupled to the output terminals of the charge pump 50 and provides the dc common mode feedback. The amplifier 70 provides negative feedback as the common center voltage of the differential output, Vop and Von, based on the reference voltage Vr, which is normally Vdd/2.

The op-amps 59 and 69 reduce the transients caused by the charge transfer as the charge pump current is switched. By way of example, when nodes N1 and N2 are not switched to Vop they are biased by the op-amp 59 that operates as a negative feedback unit-gain amplifier. In addition, the op-amp 59 suppresses any charge sharing from the parasitic capacitance on nodes N1 or N2 that can cause mismatch between the up and down current sources 52, 54.

Unfortunately, the negative feedback unity gain amplifiers 59 and 69 are difficult to design with a low power supply, which is the trend in current technology. Further, the op-amps 59, 69 require a large layout size. Thus, what is needed is an improved charge-pump circuit, e.g., that does not require a large layout and that can operate with a low power supply.

SUMMARY

A differential charge pump includes a transient reducing circuit that provides multiple switching current paths to reduce transients caused by the charge transfer as the charge pump is switched. The differential charge pump includes separate current sources in the transient reducing circuit that are switchably coupled to the non-active current source in the charge pump.

In one embodiment of the present invention, an apparatus includes a charge pump circuit that has a first current source and a second current source. A first differential pair of switches, including a first switch controlled by a first voltage signal and a second switch controlled by a second voltage signal, is coupled to the first current source. The second voltage signal is inversed with respect to the first voltage signal. The charge pump also includes a second differential pair of switches, including a third switch controlled by a third voltage signal and a fourth switch controlled by a fourth voltage signal, that is coupled to the second current source. The fourth voltage signal is inversed with respect to the third voltage signal. The first switch and the third switch are coupled in series between the first current source and the second current source, where an output terminal is disposed between the first and third switches. The second switch and the fourth switch are also coupled in series between the first current source and the second current source. The charge pump further includes a transient reducing circuit that has a third current source and a fourth current source. A fifth switch and a sixth switch are coupled in series between the third current source and the fourth current source. The fifth switch is controlled by the fourth voltage signal and the sixth switch is controlled by the second voltage signal. An input node between the fifth switch and the sixth switch is coupled to a node between the second switch and the fourth switch.

In one embodiment of the apparatus, the apparatus further includes a loop filter that is coupled to the output terminal and a common mode feedback circuit coupled to the output terminal. The charge pump may further include variable current sources that are coupled to the common mode feedback circuit.

In another embodiment of the present invention, a charge pump includes a first current source, a second current source, a third current source, and a fourth current source and a first switch and a second switch coupled in series between the first current source and the second current source. An output terminal is disposed between the first switch and the second switch. The charge pump further includes a first switchable current path from the third current source to the second current source that is open when the first switch is active; a second switchable current path from the first current source to the fourth current source that is open when the second switch is active; and a third switchable current path from the third current source to the fourth current source when neither the first switch nor the second switch are active.

In one embodiment the charge pump, the charge pump includes variable current sources coupled in parallel with the current sources, where the variable current sources are coupled to receive a common mode feedback control signal. The magnitude of the current provided by the variable current sources is less than the magnitude of the current provided by the current sources.

In yet another embodiment of the present invention, a method of controlling a charge pump comprises providing a current along a first current path from a first current source to a second current source while providing a pull up current to an output terminal. The method further includes providing a current along a second current path from a third current source to a fourth current source while providing a pull down current to the output terminal. The method further includes providing a current along a third current path from the first current source to the fourth current source while neither a pull up current nor a pull down current are provided to the output terminal. In one embodiment, the method includes providing the pull up current from the third current source to the output terminal; and providing the pull down current from the second current source to the output terminal.

In one embodiment of the method, the method of providing currents along a first current path, second current path and third current path comprise providing a portion of the currents with a constant magnitude and providing the remaining portion of the currents with a variable current. The variable current may be controlled with a common mode feedback circuit coupled to the output terminal. The magnitude of the variable current is less than the magnitude of the portion of the current with a constant magnitude for any of the currents along the first current path, the second current path and the third current path.

BRIEF DESCRIPTION OF THE DRAWINGS

FIG. 1 illustrates a conventional single ended charge pump along with a phase/frequency detector that may be used in a phase locked loop.

FIGS. 2A and 2B illustrate timing diagrams for the single-ended charge pump of FIG. 1.

DETAILED DESCRIPTION

Figure 4:
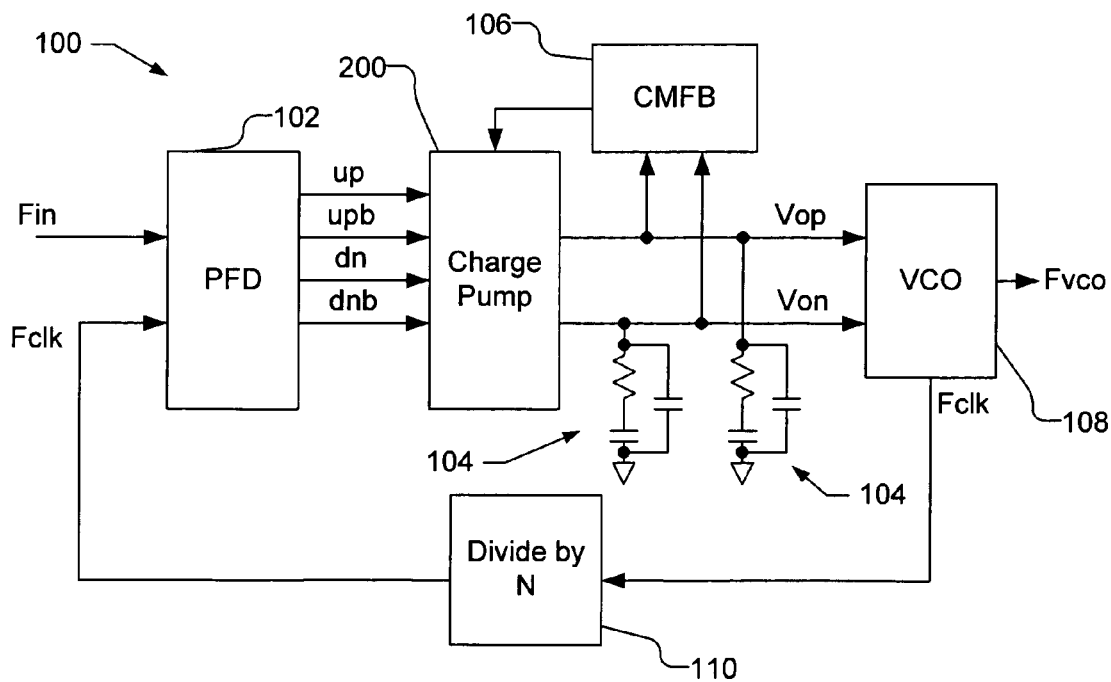
FIG. 4 illustrates a simplified fully differential $3^{rd}$ order Type II, phase locked loop circuit.

FIG. 4 illustrates a simplified fully differential $3^{rd}$ order Type II, phase locked loop (PLL) circuit 100. As shown in FIG. 4, PLL 100 includes a phase frequency detector (PFD) 102 and charge pump 200. PFD 102 receives and compares the frequency of a reference clock signal (Fin) with a feedback clock signal (Fclk) and provides differential signals (Up, /Up, Dn, and /Dn, where the bar symbol, /, signifies an inverse signal) to the charge pump 200. In response the charge pump 200 provides two output signals Vop and Von to a voltage controlled oscillator 108. Both output terminals of the charge pump 200 are coupled to loop filters 104 and a common mode feedback circuit 106. The voltage controlled oscillator 108 produces an output signal Fvco in response to the signals received from charge pump 200, and also produces a feedback clock signal Fclk, which is received by PFD 102 via an optional Divide by N circuit 110. In general, PLL circuits are well known in the art.

Figure 5:
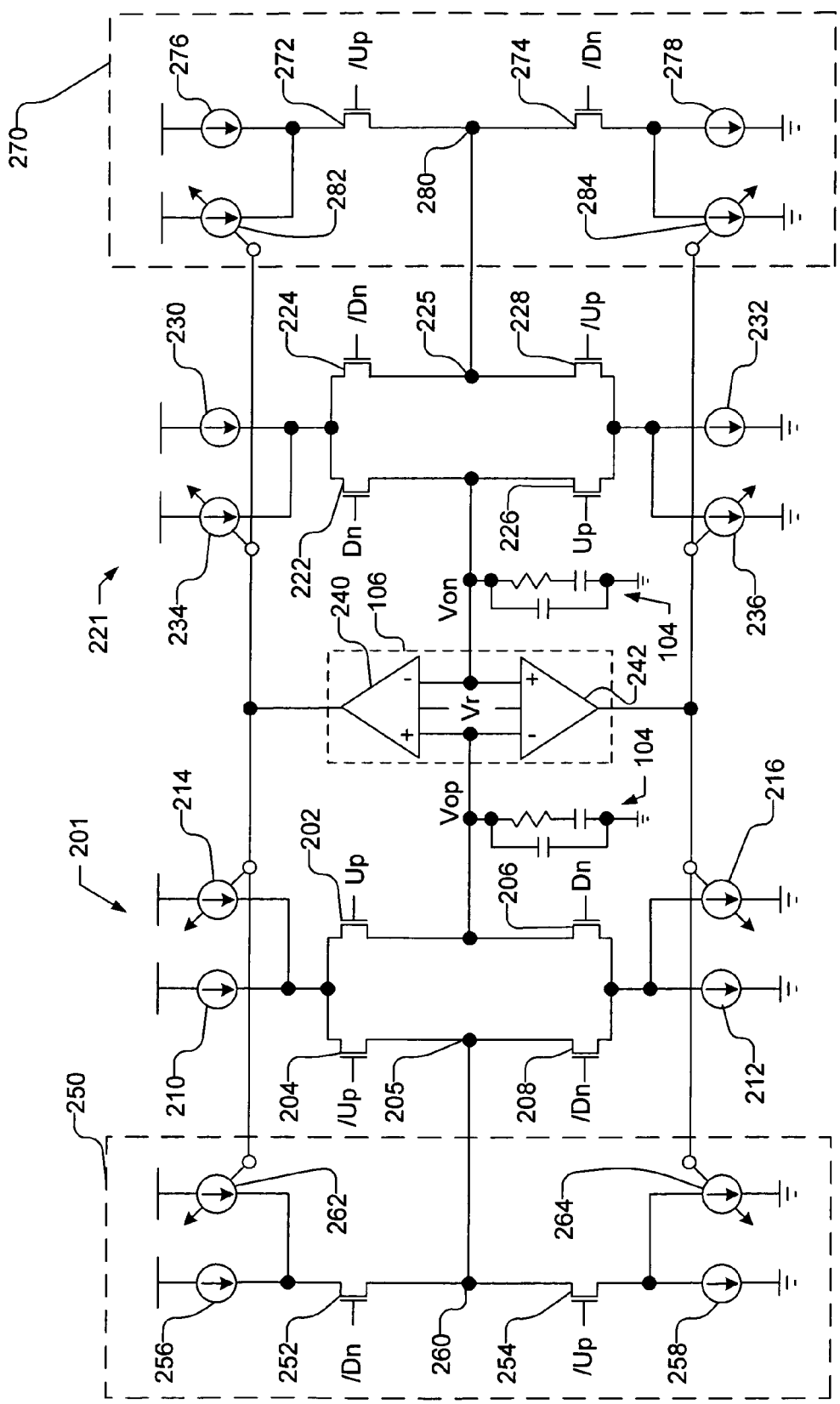
FIG. 5 illustrates a fully differential charge pump, in accordance with an embodiment of the present invention.

FIG. 5 illustrates a fully differential charge pump 200 in accordance with an embodiment of the present invention. The charge pump 200 includes a current common-mode feedback to reduce noise and mismatching effect. In addition, charge pump 200 includes transient reducing circuits 250 and 270 that eliminate the need for negative feedback unit-gain amplifiers, e.g., op amps 59 and 69 in FIG. 3, which advantageously reduces the layout size and permits lower voltage operation.

Charge pump 200 includes a first set 201 of differential switches 202 and 204, which may be transmission-gated switches, and are shown as being controlled by the differential input voltages Up and /Up, respectively. As is known in the art, transmission-gated switches include both n-channel and p-channel transistors with a differential control signal for each switch, thereby reducing the switching charge injection and clock feed-through to the outputs vop and von, which results in lower jitter performance of the PLL. By way of example, switch 202 may include an nmos transistor coupled in parallel to a pmos transistor, which are controlled by an Up signal and /Up signal, respectively. The switch 204 may have an nmos transistor coupled in parallel to a pmos transistor, which are controlled by the /Up signal and the Up signal respectively.

Figure 6:
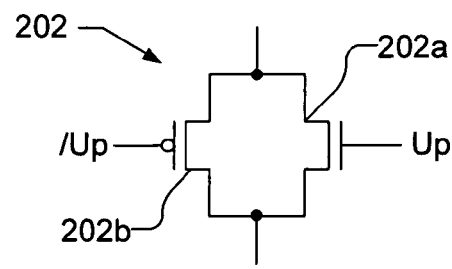
FIG. 6 illustrates a transmission gated switch that includes an nmos transistor controlled by an Up signal and a parallel coupled pmos transistor controlled by a /Up signal.

FIG. 6, by way of example, illustrates switch 202, which includes an nmos transistor 202a controlled by an Up signal and a parallel coupled pmos transistor 202b controlled by a /Up signal. When the Up signal is high and, thus, the /Up signal is low, switch 202 is conducting.

It should be understood that, if desired, all switches discussed herein may be transmission-gated switches, similar to that shown in FIG. 6. Of course, if desired, other types of switching devices, such as an n channel or p channel transistors, may be used. The switches may be referred to herein interchangeably as transistors and switches. In the present disclosure, for the sake of simplicity, each switch, herein will be illustrated as an n channel transistor that is controlled by the signal, i.e., Up, /Up, Dn, or /Dn, that renders the switch conducting. Thus, switch 202 is shown in FIG. 5 as an n channel transistor being controlled by the Up signal and switch 204 is shown as an n channel transistor being controlled by the /Up signal.

The charge pump 200 also includes differential switches 206 and 208, which are controlled by the differential input voltages Dn and /Dn, respectively. Switches 202 and 206 are coupled in series between current sources 210 and 212 as are switches 204 and 208. In one embodiment, the current source in charge pump 200 includes variable current sources 214 and 216 are coupled in parallel with static current sources 210 and 212.

A second set 221 of differential switches 222 and 224 have gates coupled to receive the differential input voltages Dn and /Dn, respectively, and differential switches 226 and 228 having gates coupled receive the differential input voltages Up and /Up, respectively. Switches 222 and 226 are coupled in series between current sources 230 and 232 as are switches 224 and 228. Variable current sources 234 and 236 may be coupled in parallel with current sources 230 and 232.

The common mode feedback circuit 106 is illustrated as two trans-conductance amplifiers 240 and 242. The output terminal of the first set 201 of differential transistors, between transistors 202 and 206, is coupled to loop filter 104, which provides control voltage Vop to the plus terminal of trans-conductance amplifier 240 and the negative terminal of trans-conductance amplifier 242. Similarly, the output terminal of the second set 221 of differential transistors, between transistors 222 and 226, is also coupled to a loop filter 104, which provides control voltage Von to the negative terminal of trans-conductance amplifier 240 and the positive terminal of trans-conductance amplifier 242. Loop filters 104 are illustrated as RC loop filters, but other loop filters may be used if desired.

Trans-conductance amplifiers 240 and 242 provide feedback signals to the variable current sources 214, 234 and 216, 236. The trans-conductance amplifiers 240 and 242 receive a reference voltage, Vr, which is, e.g., Vdd/2, so that the common mode voltage stays near the middle of the power supply range. By maintaining the common mode voltage near the middle of the power supply range, the PLL will have sufficient range to adequately adjust the differential voltage supplies.

Charge pump 200 also includes transient reducing circuits 250 and 270, which reduce transients caused by the charge transfer while the charge pump is switched.

Circuit 250 includes two series coupled switches 252 and 254, which, as described above, may be transmission-gated switches, but are illustrated herein as n channel transistors. Switches 252 and 254 have gates coupled to receive the respective /Dn and /Up voltage signals from the PFD 102 in FIG. 4. Node 260 between switches 252 and 254 is coupled to a node 205 between switches 204 and 208. Variable current sources 262 and 264 are coupled in parallel with respective current sources 256 and 258 and are controlled by the trans-conductance amplifiers 240 and 242, respectively.

Transient reducing circuit 270 is similar to circuit 250 with two series coupled switches 272 and 274 disposed between current sources 276 and 278 and variable current sources 282 and 284. Switches 272 and 274 have gates coupled to receive the respective /Up and /Dn voltage signals. A node 280 between switches 272 and 274 is coupled to a node 225 between switches 224 and 228. Variable current sources 282 and 284 are also controlled by the trans-conductance amplifiers 240 and 242, respectively.

Figure 7:
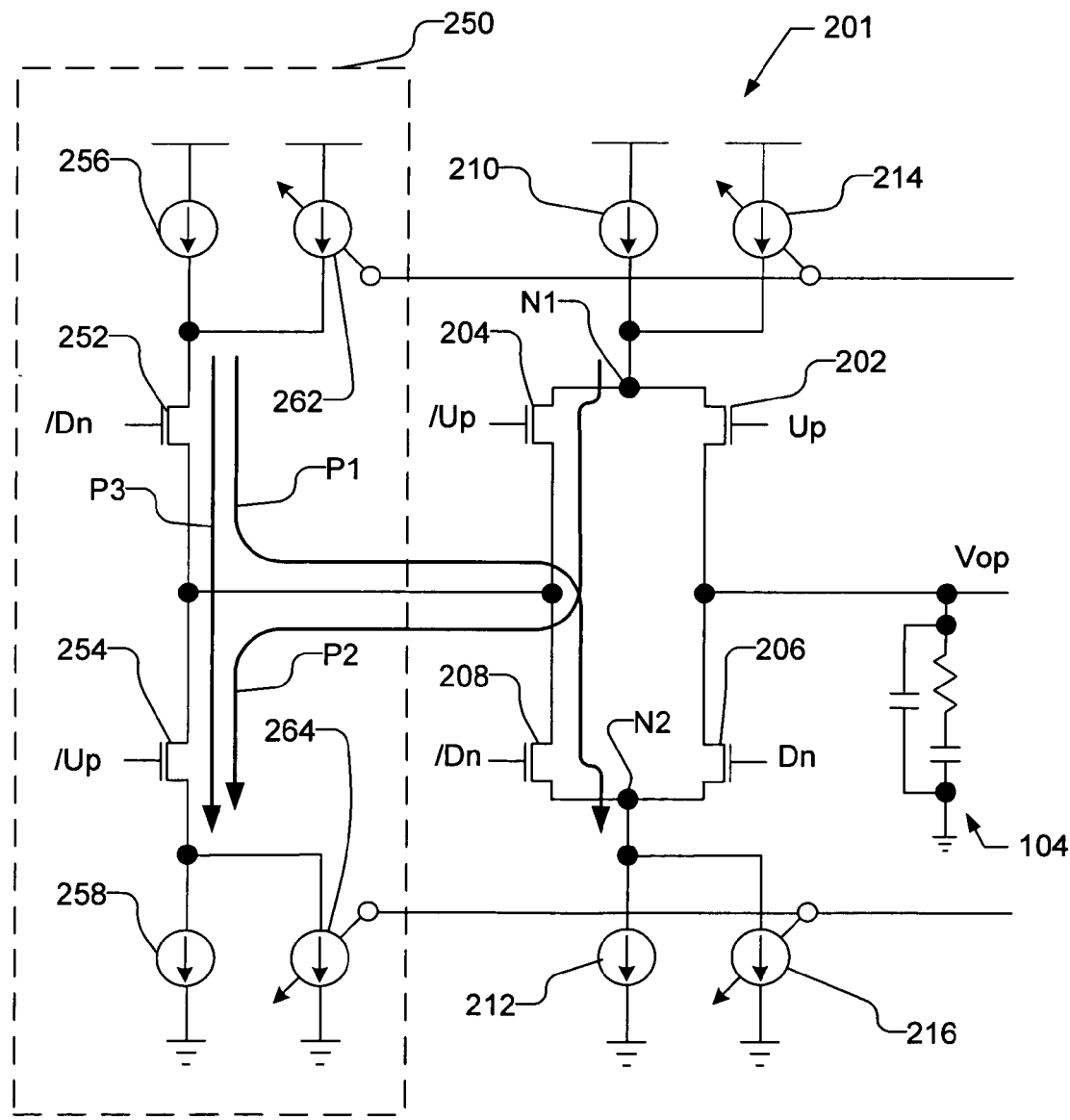
FIG. 7 illustrates switchable current paths in the charge pump of FIG. 5.

The operation of the transient reducing circuit 250 is described below in Table 1 and the current paths through the transient reducing circuit 250 are illustrated in FIG. 7. It should be understood that the Von side, circuit 270 operates in a similar manner as circuit 250.

TABLE 1

| Output Switches | | Differential Switches | | Transient Reducing Switches | | Current Path Through Transient Reducing |
|---|---|---|---|---|---|---|
| 202 | 206 | 204 | 208 | 252 | 254 | Circuit 250 |
| On | On | Off | Off | Off | Off | |
| On | Off | Off | On | On | Off | Path P1 |
| Off | On | On | Off | Off | On | Path P2 |
| Off | Off | On | On | On | On | Path P3 |

In one mode, the switches 202 and 206 are both on, i.e., conducting, and thus, switches 204 and 208 are both off, i.e., non-conducting as are the switches 252 and 254. Thus, the current is conducted from current sources 210, 214 to the current sources 212, 216 and no current is conducted through the transient reducing circuit 250. The current from sources 210, 214 is equal to the current sunk by current sources 212, 216, i.e., I210+I214=I212+I216, when the common mode feedback loop is completed.

In the next mode, the output switches 202 and 206 are on and off, respectively, and thus switches 204 and 208 are off and on, respectively, while switches 252 and 254 are on and off, respectively. Accordingly, the current is conducted along path P1 from current sources 256, 262 through switches 252 and 208 to current sources 212, 216. Therefore, the node N2 in FIG. 7 will not be pulled all the way down to ground, which results in reducing the transient noise to the Vop and reducing the current mismatching, i.e., I210+I214=I212+I216. In this mode, a pull up current is conducted from current sources 210, 214 through active switch 202 to increase control voltage Vop.

In another mode, the switches 202 and 206 are off and on, respectively, and thus switches 204 and 208 are on and off, respectively and switches 252 and 254 are off and on, respectively. Accordingly, the current is conducted along path P2 from current sources 210, 214 through switches 204 and 254 to current sources 258 and 264. Thus, the node N1 will be pulled all the way up to vdd during this mode, which again results in reducing the transient noise to the Vop and reducing the current mismatching. In this mode, the control voltage Vop is decreased by pull down current being conducted from filter 104 through switch 206 to current sources 212, 216.

In a final mode, both switches 202 and 206 are off, and thus switches 204, 208, 252, and 254 are all on. Thus, the current through the transient reducing circuit 250 is conducted along path P3 from current sources 256, 262 through switches 252 and 254 to current sources 258, 264. The current is also conducted from current sources 210, 214 to the current sources 212, 216 through switches 204 and 208.

The current paths P1, P2, and P3 from amplifier circuit 250 reduce transients caused by the charge transfer when the current charge pump is switched. When nodes N1 and N2 are not coupled to the Vop, they are biased by the P1, P2, and P3 current paths, which suppress any charge sharing from the parasitic capacitance on N1 and N2 that can cause mismatch between the Up and Dn current source. By suppressing the mismatch between Up and Dn current sources, the output jitter of the PLL 100 is advantageously reduced.

Figure 3:
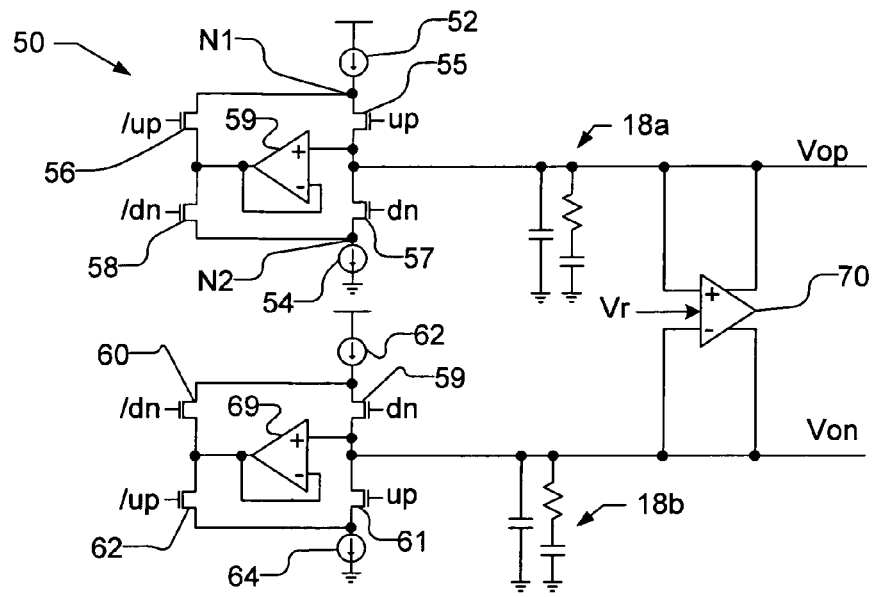
FIG. 3 illustrates a conventional fully differential charge-pump circuit with a common-mode dc feedback.

In addition, the use of amplifier circuits 250 and 270 in place of conventional circuits, as shown in FIG. 3, the area necessary to implement the device is significantly reduced. Further, the implementation is greatly simplified through the operation of the circuits 250 and 270.

The static current sources 210, 212, 230, 232, 256, 258, 276 and 278 provide approximately two thirds of the current, while the variable current sources 214, 216, 234, 236, 262, 264, 282, and 284 provide approximately one third of the current. The use of variable current sources advantageously increases sensitivity of the circuit.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. An apparatus comprising:
a charge pump circuit comprising:
a first current source and second current source;
a first differential pair of switches coupled to the first current source, the first differential pair of switches comprising a first switch controlled by a first voltage signal and a second switch controlled by a second voltage signal, the second voltage signal being inversed with respect to the first voltage signal;
a second differential pair of switches coupled to the second current source, the second differential pair of switches comprising a third switch controlled by a third voltage signal and a fourth switch controlled by a fourth voltage signal, the fourth voltage signal being inversed with respect to the third voltage signal, wherein the first switch and the third switch are coupled in series between the first current source and the second current source, an output terminal is disposed between the first and third switches, the second switch and the fourth switch are coupled in series between the first current source and the second current source;
a transient reducing circuit comprising:
a third current source and a fourth current source;
a fifth switch and a sixth switch coupled in series between the third current source and the fourth current source, the fifth switch controlled by the fourth voltage signal and the sixth switch controlled by the second voltage signal; and
an input node between the fifth switch and the sixth switch, the input node coupled to a node between the second switch and the fourth switch.

2. The apparatus of claim 1, further comprising:
a loop filter coupled to the output terminal;
a common mode feedback circuit coupled to the output terminal.

3. The apparatus of claim 2, further comprising:
a first variable current source coupled to the first differential pair of switches;
a second variable current source coupled to the second differential pair of switches;
a third variable current source coupled to the third current source; and
a fourth variable current source coupled to the fourth current source, wherein the fifth and sixth switches are coupled in series between the third variable current source and the fourth variable current source;
wherein the common mode feedback circuit is coupled to the first variable current source, the second variable current source, the third variable current source, and the fourth variable current source.

4. The apparatus of claim 3, wherein the magnitude of the current provided by each of the first variable current source, the second variable current source, the third variable current source, and the fourth variable current source is less than the magnitude of the current provided by each of the first current source, the second current source, the third current source and fourth current source.

5. The apparatus of claim 1, further comprising:
a fifth current source and sixth current source;
a third differential pair of switches coupled to the fifth current source, the third differential pair of switches comprising a seventh switch controlled by the third voltage signal and an eighth switch controlled by the fourth voltage signal;
a fourth differential pair of switches coupled to the sixth current source, the fourth differential pair of switches comprising a ninth switch controlled by the first voltage signal and a tenth switch controlled by the second voltage signal, wherein the seventh switch and the ninth switch are coupled in series between the fifth current source and the sixth current source, a second output terminal is disposed between the seventh switch and the ninth switch, the eighth switch and the tenth switch are coupled in series between the fifth current source and the sixth current source;
a second transient reducing circuit comprising:
a seventh current source and an eighth current source;
an eleventh switch and a twelfth switch coupled in series between the seventh current source and the eighth current source, the seventh switch controlled by the second voltage signal and the twelfth switch controlled by the fourth voltage signal; and
a second input node between the eleventh switch and the twelfth switch, the second input node coupled to a node between the eighth switch and the tenth switch.

6. The apparatus of claim 5, further comprising:
a first loop filter coupled to the output terminal between the first switch and the third switch;
a second loop filter coupled to the second output terminal between the seventh switch and the ninth switch;
a common mode feedback circuit coupled to the first loop filter and the second loop filter.

7. A charge pump comprising:
a first current source, a second current source, a third current source, and a fourth current source;
a first switch and a second switch coupled in series between the first current source and the second current source, an output terminal disposed between the first switch and the second switch;
a first switchable current path from the third current source to the second current source that is open when the first switch is active;
a second switchable current path from the first current source to the fourth current source that is open when the second switch is active; and
a third switchable current path from the third current source to the fourth current source when neither the first switch nor the second switch are active.

8. The charge pump of claim 7, further comprising:
a first variable current source coupled in parallel with the first current source;
a second variable current source coupled in parallel with the second current source;
a third variable current source coupled in parallel with the third current source;
a fourth variable current source coupled in parallel with the fourth current source;
wherein the first variable current source, the second variable current source, the third variable current source, and the fourth variable current source are coupled to receive a common mode feedback control signal.

9. The charge pump of claim 8, wherein the magnitude of the current provided by each of the first variable current source, the second variable current source, the third variable current source, and the fourth variable current source is less than the magnitude of the current provided by each of the first current source, the second current source, the third current source and fourth current source.

10. The charge pump of claim 8, further comprising:
a fifth current source, a sixth current source, a seventh current source, and a eighth current source;
a fifth switch and a sixth switch coupled in series between the fifth current source and the sixth current source, a second output terminal disposed between the fifth switch and the sixth switch;
a fourth switchable current path from the seventh current source to the sixth current source that is open when the fifth switch is active;
a sixth switchable current path from the fifth current source to the eighth current source that is open when the sixth switch is active; and
a seventh switchable current path from the seventh current source to the eighth current source when neither the fifth switch nor the sixth switch are active.

11. A method of controlling a charge pump, the method comprising:
providing a current along a first current path from a first current source to a second current source while providing a pull up current to an output terminal;
providing a current along a second current path from a third current source to a fourth current source while providing a pull down current to the output terminal; and
providing a current along a third current path from the first current source to the fourth current source while neither a pull up current nor a pull down current are provided to the output terminal.

12. The method of claim 11, further comprising:
providing the pull up current from the third current source to the output terminal; and
providing the pull down current from the second current source to the output terminal.

13. The method of claim 11, wherein:
providing a current along a first current path comprises providing a portion of the current with a constant magnitude and providing the remaining portion of the current with a variable current;
providing a current along a second current path comprises providing a portion of the current with a constant magnitude and providing the remaining portion of the current with a variable current;
providing a current along a third current path comprises providing a portion of the current with a constant magnitude and providing the remaining portion of the current with a variable current.

14. The method of claim 13, further comprising controlling the variable current with a common mode feedback circuit coupled to the output terminal.

15. The method of claim 14, wherein the magnitude of the variable current is less than the magnitude of the portion of the current with a constant magnitude for any of the currents along the first current path, the second current path and the third current path.

16. The method of claim 11, further comprising:
providing a current along a fourth current path from a fifth current source to a sixth current source while providing a pull up current to a second output terminal;
providing a current along a fifth current path from a seventh current source to an eighth current source while providing a pull down current to the second output terminal; and
providing a current along a sixth current path from the fifth current source to the eighth current source while neither a pull up current nor a pull down current are provided to the second output terminal.

* * * * *